(12) United States Patent
Wu

(10) Patent No.: US 6,624,016 B2
(45) Date of Patent: Sep. 23, 2003

(54) METHOD OF FABRICATING TRENCH ISOLATION STRUCTURES WITH EXTENDED BUFFER SPACERS

(75) Inventor: Ching-Yuan Wu, Hsinchu (TW)

(73) Assignee: Silicon-Based Technology Corporation, Hsinchu (TW)

( * ) Notice: Subject to any disclaimer, the term of this patent is extended or adjusted under 35 U.S.C. 154(b) by 0 days.

(21) Appl. No.: 09/789,568

(22) Filed: Feb. 22, 2001

(65) Prior Publication Data

US 2002/0115270 A1 Aug. 22, 2002

(51) Int. Cl.$^7$ .............................................. H01L 21/336
(52) U.S. Cl. ...................... 438/221; 438/218; 438/294; 438/296
(58) Field of Search .................... 438/218, 221, 438/294, 296, 359, 369, 370

(56) References Cited

U.S. PATENT DOCUMENTS 6,080,628 A * 6/2000 Cherng ...................... 438/296

* cited by examiner

Primary Examiner—Richard Elms
Assistant Examiner—Beth E. Owens
(74) Attorney, Agent, or Firm—Thomas T. Moga

(57) ABSTRACT

The trench-isolation structures for fabricating semiconductor devices using two different multilayer masking structures are disclosed by the present invention, in which the extended buffer spacers located in the isolation regions are formed on the sidewalls of two different multilayer masking structures having a masking dielectric layer on a pad-oxide layer and a masking dielectric layer on a conductive layer over a gate-oxide layer. The extended buffer spacers not only act as the etching mask for forming the trenches in the semiconductor substrate but also play significant roles for obtaining high-reliability and high-efficiency trench isolation of the present invention. The first role of the extended buffer spacers of the present invention is to offer the buffer regions for preventing the bird's beak formation around the edge of the active region during the thermal oxidation of the trench surface, so that the active area used to fabricate the active device is not sacrificed. The second role of the extended buffer spacers of the present invention is to create the buffer regions in the semiconductor substrate for the field-encroachment implant, so that much better efficiency of trench isolation can be obtained without reducing the active area. The third role of the extended buffer spacers of the present invention is to offer the capping-dielectric layers near the edges of the trench corners for eliminating the leakage due to the sharp trench corners. Therefore, the present invention may offer high-reliability and high-efficiency isolation for advance high-density integrated-circuit fabrication with maximized active area and minimized isolation area.

20 Claims, 7 Drawing Sheets

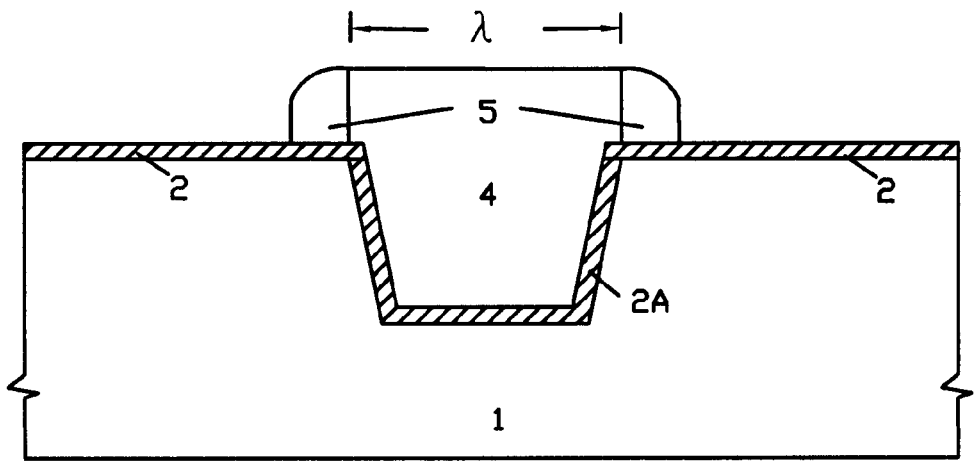
FIG.1A
(PRIOR ART)
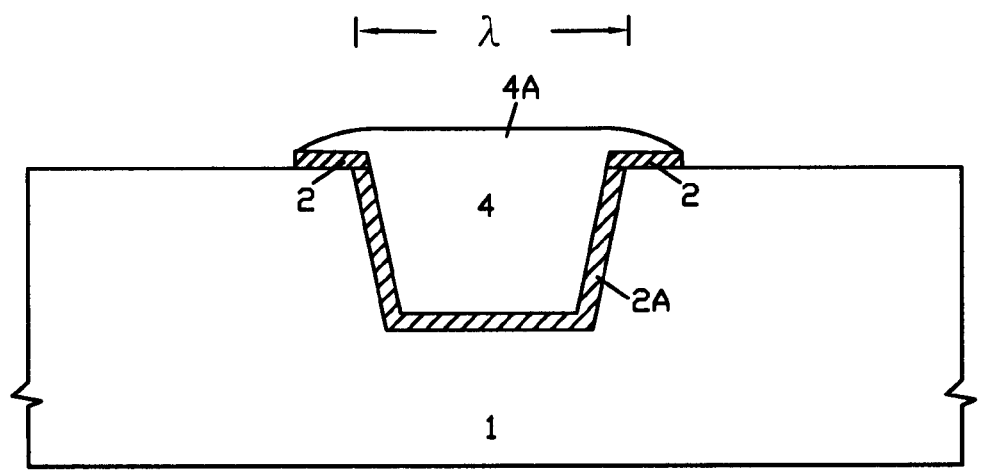
FIG.1B
(PRIOR ART)
FIG.1

METHOD OF FABRICATING TRENCH ISOLATION STRUCTURES WITH EXTENDED BUFFER SPACERS

BACKGROUND OF THE INVENTION

1. Field of the Invention

The invention relates generally to semiconductor integrated-circuit manufacturing and more particularly to the formation of trench isolation for active devices on a semiconductor substrate.

2. Description of Related Art

The technique shallow-trench-isolation (STI) has become a major isolation technique for deep-submicrometer semiconductor devices in very high density integrated circuits. The major advantages of the STI technique over the conventional LOCOS technique are a smaller isolation area, a smaller thermal budget and a better planarized surface for fine-line lithography.

However, there are still several problems which appear in existing shallow-trench-isolation techniques. These problems can be found from U.S. Pat. No. 5,966,615 by Fazan et al., as shown in FIG. 1. The oxide spacers 5 are formed on sidewalls of the planarized filling isolation-oxide layer 4 and are located in active regions having a pad-oxide layer 2 over the semiconductor substrate 1, as shown in FIG. 1A, and FIG. 1A is then etched to remove the pad oxide layer 2 and to simultaneously etch the oxide spacers 5. The small rounded caps or domes 4A are remained over the trench corners for eliminating the leakage current due to the sharp corners, as shown in FIG. 1B. Apparently, the caps or domes 4A formed in FIG. 1B are quite similar to the bird's beaks of the conventional LOCOS isolation technique and the active area is sacrificed by the regions covered with the oxide spacers 5. Moreover, the oxide spacers 5 are formed over sidewalls of planarized filling isolation-oxides 4 and both materials are oxides, a height and a width of the oxide spacers 5 become difficulty to be controlled using anisotropic dry etching, resulting in variations of the shape of the formed caps or domes 4A. In addition, no field encroachments are performed for the semiconductor surface of an oxidized trench and a semiconductor surface under the formed caps or domes in order to reduce surface leakage currents.

Basically, a thermal oxidation of a trenched monocrystalline-silicon surface is needed in order to eliminate the trench etching-induced defects and, therefore, the bird's beak formation due to the thermal oxidation of existing trench isolation structures is inevitable. Although the trench corners are slightly rounded up through the thermal oxidation of the trenched surface, the corner tips must be properly capped to eliminate the field emission due to the trench corners without sacrificing the active area and the planarization of topography. Moreover, a proper field-encroachment implant is needed in order to eliminate the double-hump current-voltage characteristics of devices formed in the active regions due to the surface inversion layer being formed near the edges of the sharp corners and an excess leakage current due to the trench surface.

It is therefore an objective of the present invention to substantially eliminate these described problems together by creating buffer spacers in the trench-isolation regions. As a consequence, the thermal oxidation of the trench surface and a field-encroachment implant can be performed for the trench-isolation structure of the present invention without sacrificing the active area, and high-reliability and high-efficiency isolation structure for devices can be obtained.

SUMMARY OF THE INVENTION

The present invention uses two multilayer masking structures being formed separately on a monocrystalline-semiconductor substrate for forming two trench isolation structures. The first multilayer masking structure consists of a masking dielectric layer on a pad oxide layer; the second multilayer masking structure consists of a masking dielectric layer on a first conductive layer over a thin gate oxide layer. The multilayer masking structure is patterned and then etched anisotropically in a self-aligned manner to remove the multilayer masking structure for forming the isolation regions. The extended buffer spacers are formed on sidewalls of remained multilayer masking structure and the exposed monocrystalline-silicon substrates are then etched to form shallow trenches. A thermal oxidation of the etched trench surface is performed to form a thin thermal-oxide layer and the oxidized trench surface is implanted by a rotated large-angle-tilt implantation method to form field-encroachment implant regions. A trench-filling dielectric layer is then deposited to fill over an etched multilayer masking structure and the planarization using the chemical-mechanical-polishing (CMP) technique is performed to remove the excess trench-filling dielectric layer over the masking dielectric layer. The planarized trench filling dielectric layer is anisotropically etched back to a depth slightly higher than a height of the pad-oxide layer for the first multilayer masking structure and to a depth approximately equal to a thickness of the masking dielectric layer for the second multilayer masking structure, and then both the masking dielectric layers are removed. The pad-oxide layer is removed anisotropically for the first multilayer masking structure and the capping-dielectric layers due to the extended buffer spacers are remained on the corners of the trenches, then a thin gate-oxide layer is formed thermally and a conductive layer acted as a gate material is deposited; however, for the second multilayer masking structure the second conductive layer is deposited. Both planarized structures are ready to define the gate lengths and further to form source and drain diffusion regions of devices using the well-known techniques. Apparently, the extended buffer spacers are formed in the isolation regions and the active area is not sacrificed. Moreover, the thermal-oxide layer grown on the trench surface and the field-encroachment implant of the trench surface are all located under the extended buffer spacers in the isolation regions without sacrificing the active area and the surface planarization. Therefore, high-reliability and high-efficiency trench isolation for scaled devices can be easily obtained by the present invention.

BRIEF DESCRIPTION OF THE DRAWINGS

FIGS. 1A and 1B show the partial cross-sectional views of a shallow-trench-isolation structure of the prior art, in which the oxide-spacers and the caps or domes are formed in the active regions and the sidewalls of the planarized filling isolation-oxides;

DETAILED DESCRIPTION OF THE PREFERRED EMBODIMENTS

Figure 2A:
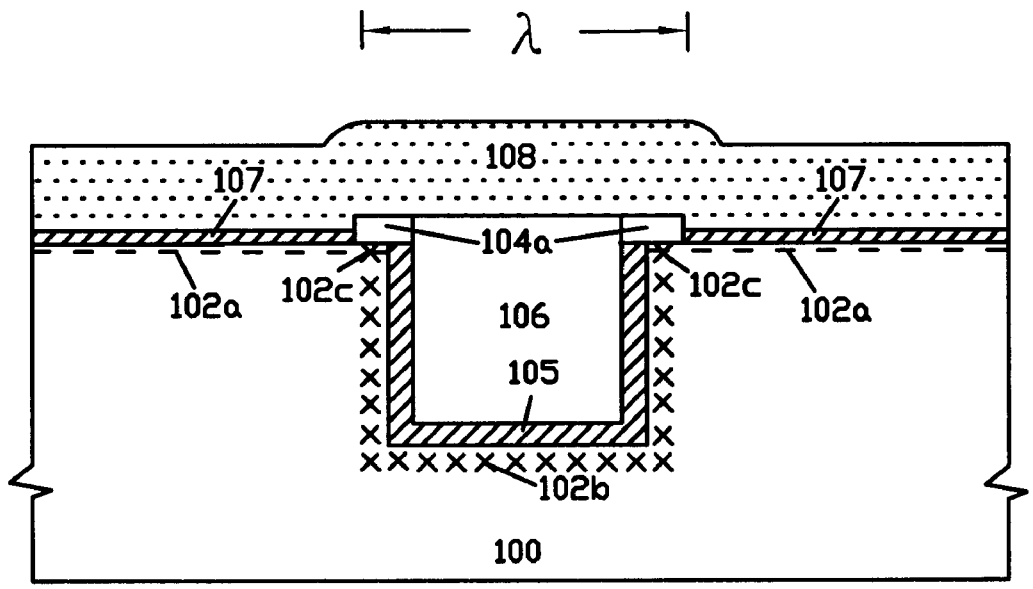
FIGS. 2A and 2B show the partial cross-sectional views of two shallow-trench-isolation structures of the present invention, in which the extended buffer spacers are formed in the isolation regions.
Figure 2B:
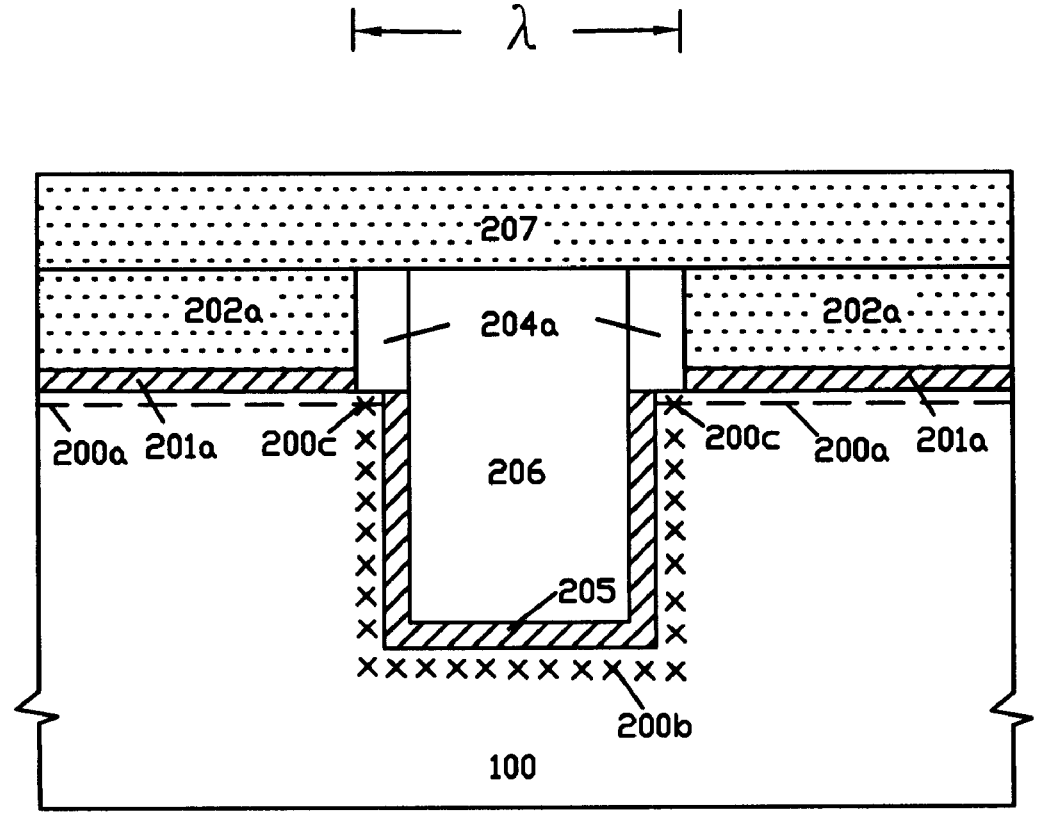

Referring now to FIG. 2, FIG. 2A shows a first embodiment of the present invention, in which a first multilayer masking structure consisting of a first masking dielectric layer on a pad-oxide layer is used; FIG. 2B shows the second embodiment of the present invention, in which a second multilayer masking structure consisting of a masking dielectric layer on a first conductive layer over a thin gate-oxide layer is used. The detailed fabrication processes and their cross-sectional views for the first and second embodiments of the present invention, as shown in FIG. 2A and FIG. 2B, are described below.

Figure 3A:
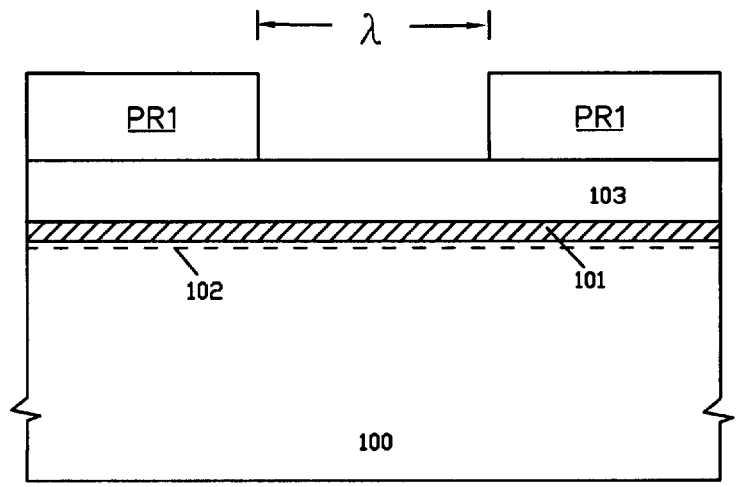
FIGS. 3A through 3I show the partial cross-sectional views of the isolation structure and the processes of a first embodiment of the present invention.

Referring now to FIG. 3A through FIG. 3I, there are shown the fabrication process steps and their cross-sectional views of the first embodiment of the present invention. FIG. 3A shows a pad-oxide layer 101 is thermally grown on a monocrystalline-semiconductor substrate 100. The monocrystalline-semiconductor substrate 100 can be a retrograde p-well or a retrograde n-well or regrograde twin-wells formed in a monocrystalline semiconductor substrate 100. For simplicity, the monocrystalline-semiconductor substrate 100 shown in FIG. 3A is a p-type substrate or a retrograde p-well. The first boron implantation is performed across the pad-oxide layer 101 into a surface of the monocrystalline-semiconductor substrate 100 to adjust the threshold-voltage of devices and a second boron implantation can also be performed to form the punch-through stops if needed. These implants are indicated by a dashed line 102 shown in FIG. 3A. A masking dielectric layer 103 is deposited on the pad-oxide layer 101. The masking dielectric layer 103 is preferably made of silicon-nitrides deposited by low-pressure chemical-vapor-deposition (LPCVD), which is used as a hard mask for etching trenches. The well-known photoresist PR1 is deposited and patterned to define a width of an isolation region λ, as shown in FIG. 3A, where λ is a minimum-feature-size of technology used.

Figure 3B:
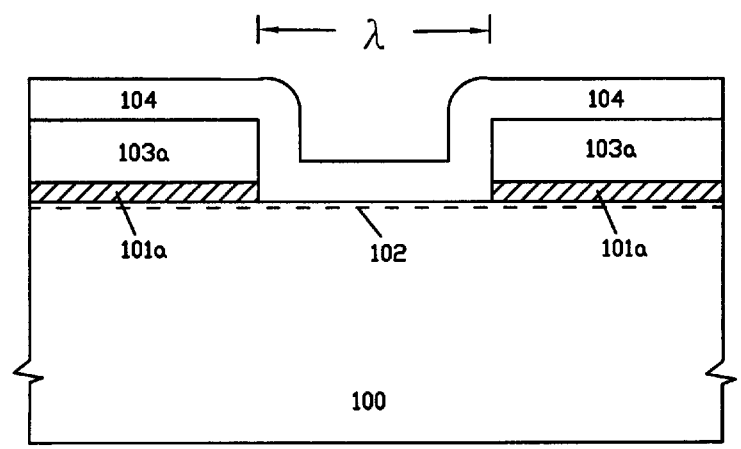

Through the patterned masking photoresist PR1, the masking dielectric layer 103 is anisotropically etched by reactive-ion etching and then the patterned masking photoresist PR1 is stripped by well known oxygen plasma. The pad-oxide layer 101 is then selectively removed by anisotropic dry etch or well-known wet etch by using an etched masking dielectric layer 103a as an etching mask. A conforming dielectric layer 104 is deposited over the etched first multilayer masking structure, as shown in FIG. 3B. The conforming dielectric layer 104 is preferably a conforming silicon-oxide layer deposited by using thermal decomposition of tetraethoxysilane (TEOS) and the thickness of the conforming dielectric layer 104 is preferably between about 150 to 400 Angstroms.

Figure 3C:
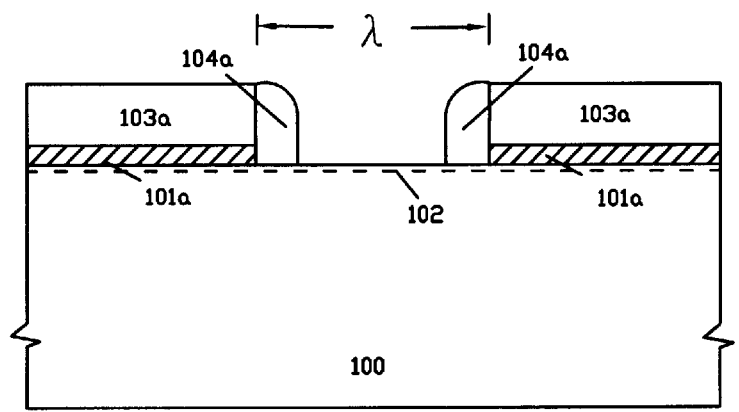
Figure 3D:
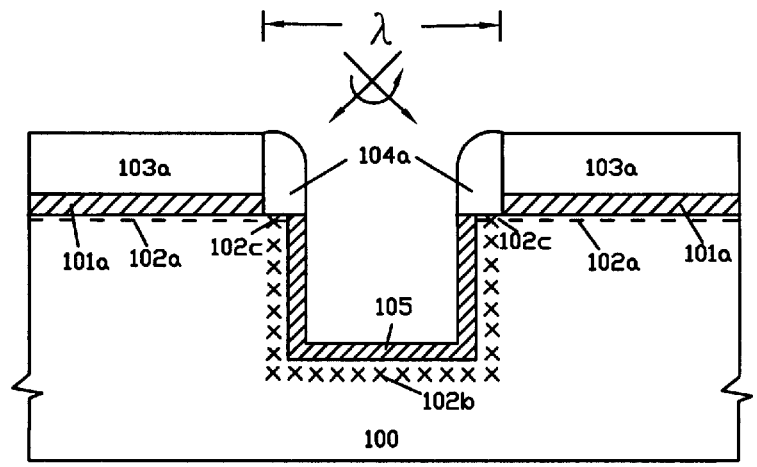

The conforming dielectric layer 104 shown in FIG. 3B is anisotropically etched back to form the extended buffer-spacers 104a on the sidewalls of the etched first multilayer masking structure, as shown in FIG. 3C, followed by anisotropically etching an exposed monocrystalline-semiconductor substrate 100 to a depth of between about 2000 to 5000 Angstroms to form the trenches. An etched monocrystalline-semiconductor surface of the trenches is then oxidized to form a thermal-oxide layer 105. The thickness of the thermal-oxide layer 105 is preferably between 50 to 150 Angstroms and this oxidation process is needed to eliminate the trench etching-induced defects. The field-encroachment implant is then performed by implanting boron impurities into the trench surface regions of the oxidized monocrystalline-semiconductor substrate to form the implanted regions 102b and the surface regions under the extended buffer spacers 104a to form the implanted regions 102c, as shown in FIG. 3D. It is clearly seen from FIG. 3D that the extended buffer spacers 104a are formed in the isolation regions and act as the buffer layers for oxidizing the trench surface and performing the field-encroachment implant without affecting the active area.

Figure 3E:
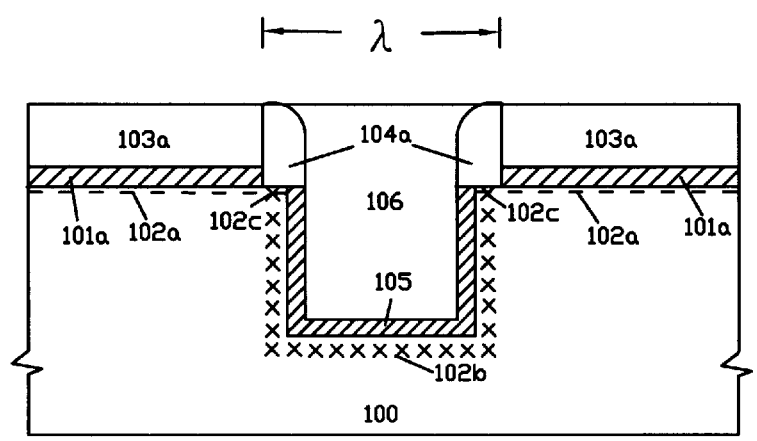
Figure 3F:
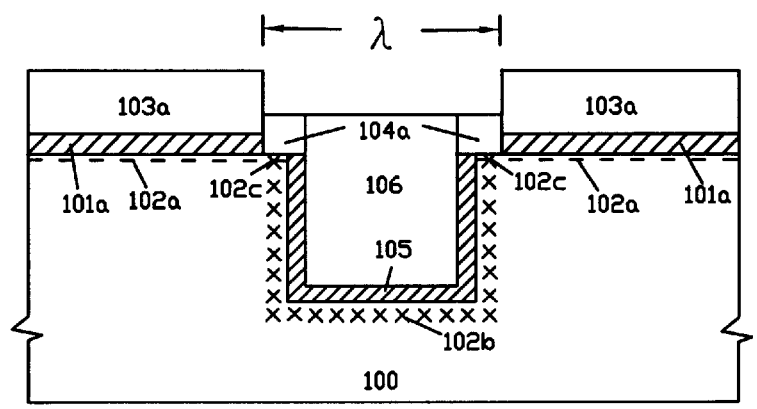
Figure 3G:
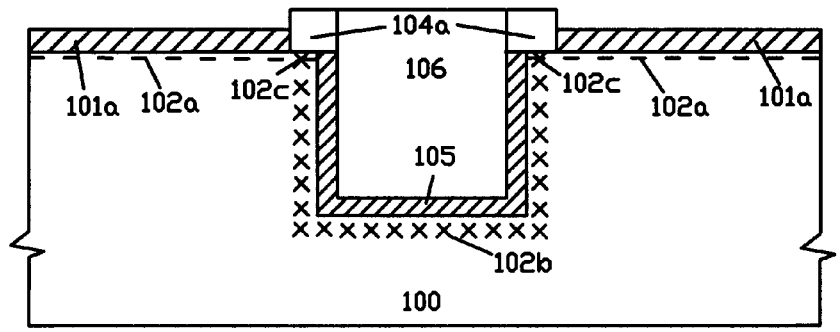

A first trench-filling dielectric layer 106 is deposited over a structure surface shown in FIG. 3D and followed by planarizing a formed structure surface using chemical-mechanical-polishing (CMP) to remove the excess trench-filling dielectric layer 106 with the masking dielectric layer 103a used as a polishing stop, as shown in FIG. 3E. The trench-filling dielectric layer 106 can be deposited by high-density plasma CVD (HDPCVD) or other CVD and is preferably a thick silicon-oxide film using TEOS or silane as a silicon source. The planarized trench-filling dielectric layers 106 are then etched by using anisotropic dry etching or well-known wet-chemical etching in a self-aligned manner to a depth slightly smaller than a thickness of the first masking dielectric layer 103a, as shown in FIG. 3F, and then the first masking dielectric layers 103a are removed by wet-chemical etching or anisotropic dry etching, as shown in FIG. 3G. It is clearly seen that a step between the pad-oxide layer 101a and a remained trench-filling dielectric layer 106 is formed and this step is important to form the caps over the corners of the trenches without sacrificing the planarization of the isolation structure.

Figure 3H:
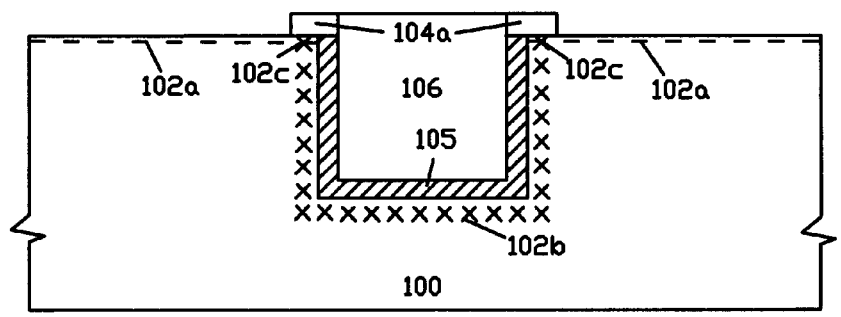
Figure 3I:
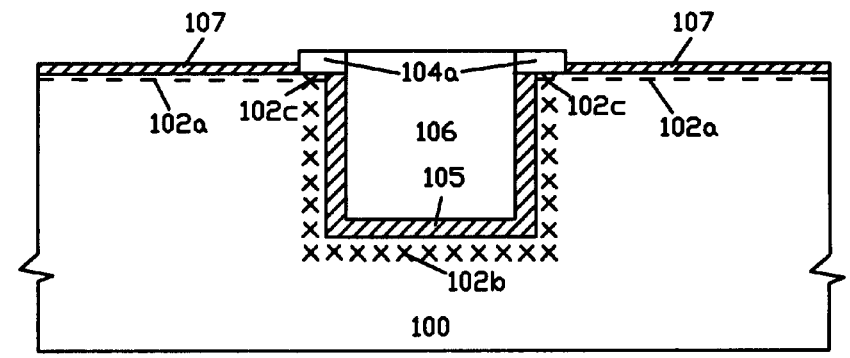

The pad-oxide layers 101a are removed by well-known wet chemical etching or anisotropic dry etching and the caps are remained on the corners of the trenches, as shown in FIG. 3H. A thin gate-oxide layer 107 is then thermally grown on the exposed monocrystalline semiconductor surface, as shown in FIG. 3I. A conductive layer 108 comprising a polycrystalline-silicon layer or an amorphous-silicon layer, which is acts as a conductive gate, is deposited by using LPCVD, as shown in FIG. 2A.

Apparently, the extended buffer spacers 104a of the present invention are formed in the isolation regions and also act as the buffer layers for the thermal oxidation and the field-encroachment implant of the trench surface without sacrificing the active area. Moreover, the extended buffer spacers are also used to form the caps over the corners of the trenches to eliminate the leakage current from the trench corners due to field emission. In addition, since the semiconductor surface under the caps and the trench surface 104a are properly implanted, the double-hump I–V characteristics of devices fabricated in the active region due to the surface inversion under the caps can be eliminated, the surface leakage currents due to the surface depletion regions and the interface traps of the trench surface can be much reduced, and the inverse narrow-width effects appeared in U.S. Pat. No. 5,966,615 due to the depletion charges under the oxide-spacers in the active regions can be much reduced for narrow-width devices and the conventional narrow-width effects appearing in the prior art having no oxide-spacers can also be much reduced by the proper control of the width of the extended buffer spacers.

Figure 4A:
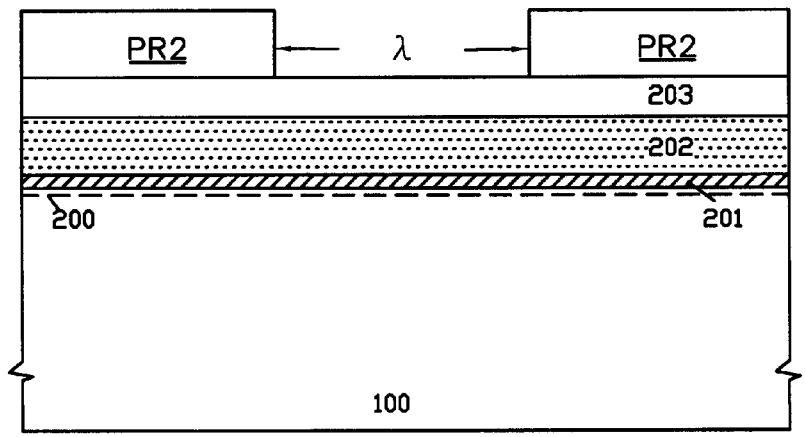
FIGS. 4A through 4F show the partial cross-sectional views of the isolation structure and the processes of a second embodiment of the present invention.
Figure 4B:
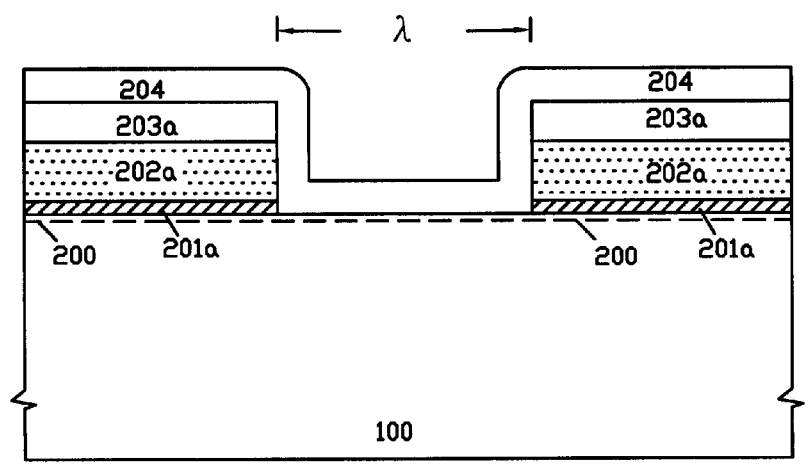
Figure 4C:
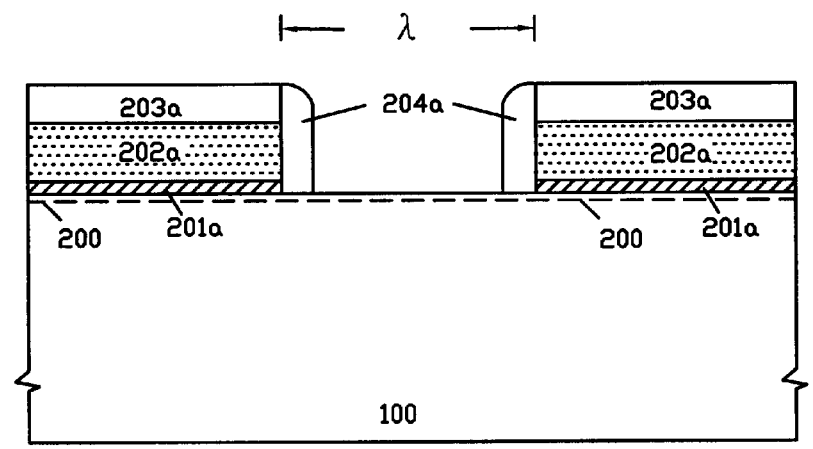
Figure 4D:
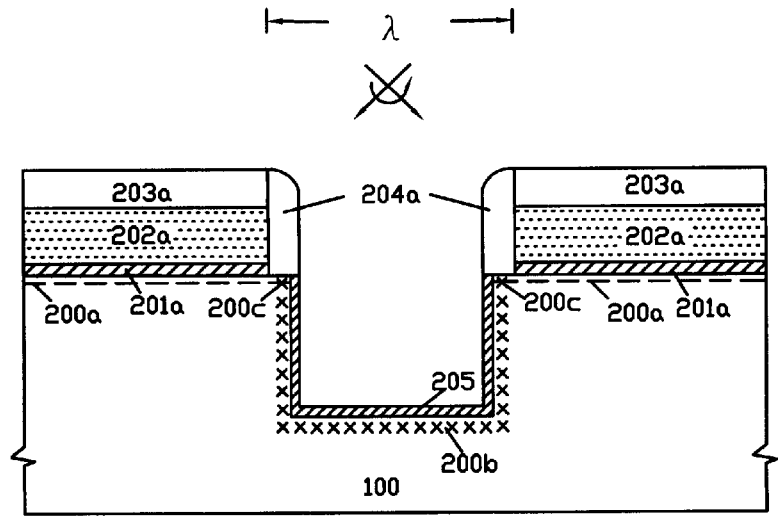

Referring now to FIGS. 4A through 4F, there are shown the fabrication process steps and their cross-sectional views of the second embodiment of the present invention. FIG. 4A shows a second multilayer masking structure formed on a monocrystalline-semiconductor substrate having the surface implants for threshold-voltage adjustment or punch-through stops, as described in the first embodiment of the present invention. A thin gate-oxide layer 201 is formed thermally over the monocrystalline-semiconductor substrate 100 and a first conductive layer 202 comprising a polycrystalline-silicon layer or an amorphous-silicon layer is deposited on the thin gate-oxide layer 201 using LPCVD, followed by depositing a masking dielectric layer 203 using LPCVD. The masking dielectric layer 203 is preferably a silicon-nitride layer. The masking photoresist PR2 is patterned to define a width of an isolation regions $\lambda$, where $\lambda$ is a minimum-feature size of technology used, and the masking dielectric layer 203 is anisotropically removed by using dry etching and the patterned second masking photoresist PR2 is then stripped. The first conductive layer 202 is anisotropically removed in a self-aligned manner using dry etching, followed by selectively removing the thin gate-oxide layer 201 using either anisotropic dry etching or wet-chemical etching. A conforming dielectric layer 204 is formed by LPCVD and is preferably a conforming silicon-oxide layer deposited by LPCVD using thermal decomposition of TEOS, as shown in FIG. 4B. The conforming dielectric layer 204 is then anisotropically etched back to form the extended buffer spacers 204a on the sidewalls of the etched second multilayer masking structure, as shown in FIG. 4C, followed by etching the exposed monocrystalline semiconductor substrate 100 to a depth of approximately between about 2000 to 5000 Angstroms to form the shallow trenches. The formed shallow trenches are then oxidized to form a thin thermal oxide layer 205 over the exposed trench surface, followed by implanting boron impurities into the trench surface of the monocrystalline semiconductor substrate 100 to form the field-encroachment implant regions 200b, as shown in FIG. 4D. The field-encroachment implant can be performed by using a rotated large-tilt-angle implantation technique.

Figure 4E:
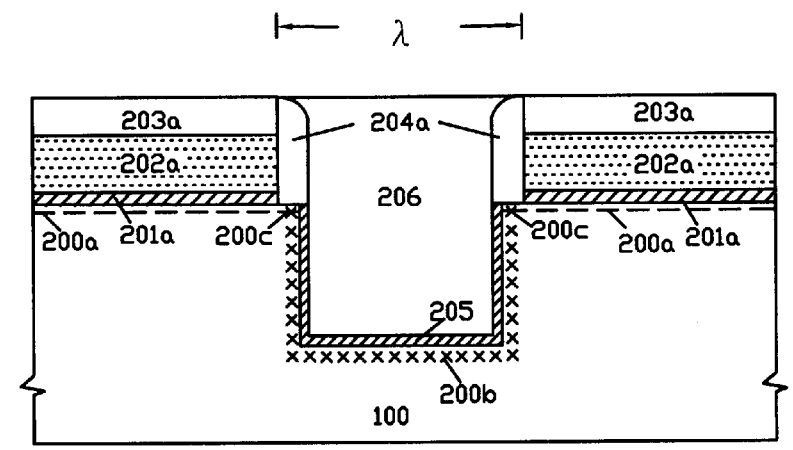

A trench-filling dielectric film 206 is deposited over a formed structure and the CMP is then performed to planarize the structure surface by removing the excess trench-filling dielectric film 206 over the masking dielectric layer 203a and the second masking dielectric layers 203a are acted as the polishing stop, as shown in FIG. 4E. The second trench filling dielectric film 206 can be preferably a conformable thick silicon-oxide film deposited preferably by using high density plasma CVD, as described in the first embodiment of the present invention.

Figure 4F:
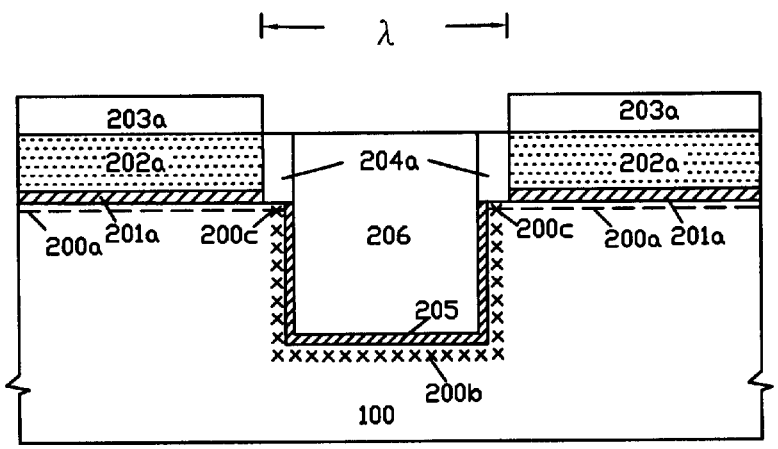

The planarized second trench-filling dielectric film 206 and the extended buffer spacers 204a shown in FIG. 4E are anisotropically etched in a self-aligned manner to a depth of approximately the thickness of the second masking dielectric layer 203a, as shown in FIG. 4F, then followed by removing the masking dielectric layer 203a using wet-chemical etching or anisotropic dry etching. The structure surface formed becomes very flat and a third conductive layer 207 preferably a polycrystalline-silicon layer or a polycide layer or a metal layer is then deposited, as shown in FIG. 2B. It is clearly seen from FIG. 2B that the described major advantages of the first embodiment of the present invention are still valid for the second embodiment of the present invention. However, the planarization of the formed structure surface of the second embodiment of the present invention is better than that of the first embodiment of the present invention for fine-line lithography.

The embodiments shown in FIG. 2 through FIG. 4 use a p-type substrate or a p-well formed for demonstration only. It should be well understood by those skilled in the art that the opposite doping type of the substrate or the well can also be used to simultaneously fabricate the opposite conductivity type of devices by using the methods as disclosed by the present invention with only slight modification of the implant doping type.

While the invention has been particularly shown and described with reference to the preferred embodiments thereof, it will be understood by those skilled in the art that various changes in form and details may be made without departing from the true spirit and scope of the invention.

What is claimed is:

1. A method of fabricating a trench isolation structure for semiconductor devices having extended buffer spacers formed in isolation regions to offer buffer regions for oxidizing trench surfaces, forming field-encroachment implant regions and capping corners of trenches without sacrificing active area, comprising the steps of:

providing a semiconductor substrate;

forming a multilayer masking structure on said semiconductor substrate with at least a masking dielectric layer being formed on a top surface of said semiconductor substrate;

patterning said multilayer masking structure through a patterned masking photoresist to define said isolation regions followed by anisotropically etching said masking dielectric layer to form an etching mask and then stripping said patterned masking photoresist;

etching anisotropically remained layer or layers of said multilayer masking structure in said isolation regions;

depositing a conforming dielectric layer and forming said extended buffer spacers on sidewalls of removed layer or layers of said multilayer masking structure in said isolation regions by using an etch-back technique;

etching anisotropically said semiconductor substrate to form said trenches using said masking dielectric layer and said extended buffer spacers as an etching mask;

oxidizing said trench surfaces to form a thin thermal oxide layer to eliminate trench etching-induced defects;

performing a field-encroachment implant into said trench surfaces of said semiconductor substrate and surface regions of said semiconductor substrate under said extended buffer spacers;

depositing a trench-filling dielectric layer over a formed structure surface to a level higher than said masking dielectric layer; and planarizing said formed structure surface using chemical mechanical polishing (CMP) to remove said trench-filling dielectric layer over said masking dielectric layer.

2. The method of claim 1, wherein said semiconductor substrate is a p-type substrate having retrograde p-wells and retrograde n-wells formed therein.

3. The method of claim 1, further comprising the steps of implanting said semiconductor substrate with doping impurities through a pad oxide layer or a sacrificing oxide layer to adjust the threshold voltage of the semiconductor devices, further comprising an additional implant of doping impurities in said semiconductor substrate to form punch-through stops for the semiconductor devices.

4. The method of claim 1, wherein said multilayer masking structure consists of said masking dielectric layer formed on a pad oxide layer.

5. The method of claim 1, wherein said multilayer masking structure consists of said masking dielectric layer formed on a first conductive layer, said first conductive layer being formed over a thin gate oxide layer.

6. The method of claim 1, wherein said extended buffer spacers are preferably made of silicon oxide deposited by a low pressure chemical vapor deposition (LPCVD) system.

7. The method of claim 1, wherein a depth of said trenches in said semiconductor substrate is between about 2000 to 5000 Angstroms.

8. The method of claim 1, wherein a thickness of said thin thermal oxide layer formed on said trench surfaces is between about 50 to 150 Angstroms.

9. The method of claim 1, wherein said field-encroachment implant into said trench surfaces of said semiconductor substrate and said surface regions of said semiconductor substrate under said extended buffer spacers is preferably performed by a rotated large-angle-tilt implantor.

10. The method of claim 1, wherein said trench-filling dielectric layer is preferably made of silicon oxide and is preferably deposited by a high density plasma CVD system.

11. The method of claim 1, wherein a width of said extended buffer spacer is between about 150 to 400 Angstroms.

12. The method of claim 9, wherein a dose of said field-encroachment implant using a rotated large-angle-tilt implantor is between about $10^{13}$ to $10^{14}$ atoms/cm$^2$.

13. A method of fabricating a trench isolation structure for semiconductor devices having extended buffer spacers formed in isolation regions to offer buffer regions for oxidizing trench surfaces, forming field-encroachment implant regions and capping corners of trenches without sacrificing active area, comprising the steps of:

providing a semiconductor substrate;

forming a multilayer masking structure on said semiconductor substrate, wherein said multilayer masking structure comprises a masking dielectric layer over a pad oxide layer;

patterning said multilayer masking structure through a patterned masking photoresist to define said isolation regions followed by anisotropically etching said masking dielectric layer to form an etching mask and then stripping said patterned masking photoresist;

removing anisotropically said pad oxide layer of said multilayer masking structure in said isolation regions in a self-aligned manner;

forming extended buffer spacers over sidewalls of said patterned multilayer masking structure in said isolation regions;

etching anisotropically said semiconductor substrate to form said trenches using said masking dielectric layer and said extended buffer spacers as an etching mask;

oxidizing said trench surfaces to form a thin thermal oxide layer to eliminate trench etching-induced defects;

performing a field-encroachment implant across said thin thermal oxide layer into said trench surfaces of said semiconductor substrate and surface regions of said semiconductor substrate under said extended buffer spacers by using a rotated large-angle-tilt implantor;

depositing a trench-filling dielectric layer over a formed structure to a level higher than said masking dielectric layer;

planarizing said formed structure surface using CMP to remove said trench-filling dielectric layer over said masking dielectric layer to form planarized trench-filling dielectric layers between said extended buffer spacers in said isolation regions;

etching back said planarized trench-filling dielectric layers and said extended buffer spacers using said masking dielectric layers as the etching mask;

removing selectively said masking dielectric layers using wet-chemical etching or anisotropic dry etching;

removing said pad oxide layers and simultaneously etching remained portions of said extended buffer spacers and said planarized trench-filling dielectric layers in said isolation regions to form capping dielectric layers over said isolation regions;

oxidizing each exposed surface of said semiconductor substrate to form a thin gate oxide layer; and depositing a conductive layer over said formed structure surface.

14. The method of claim 13, wherein an etching depth of said planarized trench-filling dielectric layer and said extended buffer spacers is approximately equal to a thickness of said masking dielectric layer minus a thickness of said capping dielectric layer remained over said semiconductor substrate under said extended buffer spacers.

15. The method of claim 13, wherein said conductive layer comprises a doped polycrystalline silicon layer, a polycide layer, or a doped amorphous silicon layer capped with a metal-disilicide layer.

16. The method of claim 13, wherein said masking dielectric layer is preferably made of silicon nitride deposited by a low pressure chemical vapor deposition system.

17. A method of fabricating a trench isolation structure for semiconductor devices having extended buffer spacers formed in isolation regions to offer buffer regions for oxidizing trench surface, forming field-encroachment implant regions and capping corners of trenches without sacrificing active area, comprising the steps of:

providing a semiconductor substrate;

forming a multilayer masking structure on said semiconductor substrate, wherein said multilayer masking structure comprises a masking dielectric layer on a first conductive layer over a thin gate oxide layer;

patterning said multilayer masking structure through a patterned masking photoresist to define said isolation regions followed by anisotropically etching said masking dielectric layer to form an etching mask and then stripping said patterned masking photoresist;

removing sequentially said first conductive layer and said thin gate oxide layer of said multilayer masking structure in said isolation regions using anisotropic dry etching in a self-aligned manner;

forming extended buffer spacers over sidewalls of said patterned multilayer masking structure in said isolation regions;

etching anisotropically said semiconductor substrate to form said trenches using said masking dielectric layer and said extended buffer spacers as an etching mask;

oxidizing said trench surfaces to form a thin thermal oxide layer to eliminate trench etching-induced defects;

performing a field-encroachment implant across said thin thermal oxide layer into said trench surfaces of said semiconductor substrate and surface regions of said semiconductor substrate under said extended buffer spacers using a rotated large-angle-tilt implantor;

depositing a trench-filling dielectric layer over a formed structure to a level higher than said masking dielectric layer;

planarizing said formed structure surface using CMP to remove said trench-filling dielectric layer over said masking dielectric layer to form planarized trench-filling dielectric layers between said extended buffer spacers in said isolation regions;

etching back said planarized trench-filling dielectric layers and said extended buffer spacers to a thickness of said masking dielectric layer using said masking dielectric layer as an etching mask;

removing selectively said masking dielectric layer using wet-chemical etching or anisotropic dry etching; and depositing a second conductive layer over said formed structure surface.

18. The method of claim 17, wherein said second conductive layer comprises a doped polycrystalline silicon layer, a polycide layer, a silicide layer, or a metal layer and said first conductive layer comprises a doped polycrystalline silicon or doped amorphous silicon layer.

19. The method of claim 17, wherein said planarized trench-filling dielectric layer is preferably made of silicon oxide as deposited by a high density plasma chemical vapor deposition system.

20. The method of claim 17, wherein said extended buffer spacers are preferably made of silicon oxide as deposited by a low pressure chemical vapor deposition system.

* * * * *